United States Patent [19]

Rainwater

[11] Patent Number: 5,292,548
[45] Date of Patent: Mar. 8, 1994

[54] SUBSTRATES USED IN MULTILAYERED INTEGRATED CIRCUITS AND MULTICHIPS

[75] Inventor: Jewel G. Rainwater, North Richland Hills, Tex.

[73] Assignee: Vistatech Corporation, Syracuse, N.Y.

[21] Appl. No.: 860,063

[22] Filed: Mar. 30, 1992

Related U.S. Application Data

[63] Continuation-in-part of Ser. No. 504,330, Apr. 3, 1990, Pat. No. 5,101,319.

[51] Int. Cl.$^5$ .............................................. B05D 5/12
[52] U.S. Cl. .................................. 427/97; 427/126.5; 427/278; 427/365; 427/376.2; 427/419.2
[58] Field of Search ............... 427/97, 126.5, 278, 427/365, 376.2, 419.2

[56] References Cited

U.S. PATENT DOCUMENTS 4,586,972 5/1986 Yokotani et al. ............ 29/25.41
4,645,552 2/1987 Vitriol et al. ................ 29/829

Primary Examiner—Shrive Beck
Assistant Examiner—Benjamin L. Utech
Attorney, Agent, or Firm—Samuels, Gauthier & Stevens

[57] ABSTRACT

A method for making a substrate for use in a multilayered integrated circuit or multichip module which includes coating a conductive material on a surface of a support sheet to form a conductive circuit and then drying the sheet. Next, a coating of a layer of dielectric layer is placed on the support surface in the areas where the conductive material is not cast. After which the coated sheet is densified to form a densified conductive circuit embedded dielectric layer. A second coating of a dielectric is placed over the first densified conductive circuit embedded dielectric layer such that the second layer is characterized by vias therein which are in register with at least a portion of the conductive circuit. The vias in the second dielectric layer are filled to form electrically conductive vias and then densifying to form the substrate.

21 Claims, 2 Drawing Sheets

SUBSTRATES USED IN MULTILAYERED INTEGRATED CIRCUITS AND MULTICHIPS

CROSS REFERENCE TO RELATED APPLICATION

This application is a continuation-in-part of U.S. Ser. No. 07/504,330 filed Apr. 3, 1990 now U.S. Pat. No. 5,101,319 issued Mar. 31, 1992.

BACKGROUND OF THE INVENTION

1. Field of the Invention

The present invention relates to a composite multilayer substrate that is used in the manufacture of multilayered IC's or multichip modules.

2. Description of the prior art

It is well known in the prior art to utilize a thin film structure that can be formed from multilayers of either high or low temperature pre-fired or co-fireable ceramic green tape with power and ground connections between the multilayers. The so-called co-fireable ceramic tape is a flexible substrate in the green (unfired) state before heating and is manufactured by various companies including DuPont who sells its product under the trademark Greentape. The thin and flexible material becomes rigid after it is subjected to heat as by firing in an oven. Typically this greentape is commercially available for use with high density packages of IC's. In some cases, a high temperature plastic material, such as polyimides, are used as a substrate for co-fireable structures.

Electrically conductive circuits are screen printed or otherwise deposited on the dielectric substrate. Connections between layers of the substrate that are aligned and stacked are made by forming vias and filling with a conductive material. The substrates are typically machined or formed; fired if necessary and drilled using mechanical tools, lasers or chemical etching. Both active and passive components are attached individually onto the substrates, which substrates have suitable dielectric thermal and physical properties, and are connected electrically to the circuit by proper placement and soldering by using conductive cements.

Often the circuits, including printed resistors and layered capacitors, are fired before other components are attached to each substrate and the substrates aligned, stacked, packaged and tested.

Current multilayered IC's or multichip modules have low manufacturing yields and premature field failures due to substrate cracks, conduit electrical shorts and poor component adhesion to the substrate. These problems increase the number of layers required and increase component density. Often the vias will crack as a result of material expansion mismatch, residual stress in the substrate and poor via filling.

SUMMARY OF THE INVENTION

The present invention uses a densified dielectric with an embedded conductive circuit which allows the use of stronger, thinner and flatter layers. The invention improves alignment between layers and vias, reduces layer manufacturing costs and allows use of a wider variety of substrate materials.

Gravure printing of the vias improves line resolution, lowers print costs for high volume run and improves print- to-print duplication accuracy.

The process of the invention reduces the number of steps in forming a substrate resulting in a stronger but more compact substrate which has better line resolution, produces smaller vias with improved contact, lowers residual stress levels in the layers and reduces the cost of manufacturing.

Broadly the invention comprises a process for producing a substrate and the substrate produced by the process. A conductive circuit is formed on a support surface, such as a polyester, polyethylene, polyimide, film etc. Subsequently, a dielectric having the same thickness as the conductive circuit is placed on the support surface covering the areas of the support surface that are not covered by the conductive circuit thereby forming a first conductive circuit surrounded on three sides by a dielectric layer. The first dielectric layer is densified as taught in the parent application. The thickness of the first dielectric layer may be between 50 to 500$\mu$ inches after densification. The conductive circuit may include printed electrodes for capacitors or resistors. These conductive circuits may be printed by screen printing, ink jet, gravure roll or vapor deposition. The dielectric may be applied by screen printing, ink jet or gravure roll. Subsequently, a second dielectric layer is formed over the first dielectric layer, which second layer is characterized by properly positioned voids, termed vias. These vias are preferably circular but may have other geometric shapes. They range in size from 50 to 1,000$\mu$ inches in diameter. These vias are formed where it is desired to ultimately have an electrical connection between the circuit and a component to be attached to the substrate. The second dielectric layer may range from 0.3 to 10 mils in thickness. Subsequently, a conductive material, such as a conductive ink, which is compatible with the electrical characteristics of the circuit is deposited into and fills the vias in the second dielectric layer forming the conductive paths. Separate depositions of the same conductive materials into the vias in the second dielectric layer, separate depositions of different conductive materials into different vias in the second dielectric layer and/or the formation of additional second dielectric layers with the same and/or different conductive materials in the vias with single or multiple depositions are within the scope of the invention.

Preferably, for forming the second dielectric layer and depositing the ink, gravure rolls are used. However, other depositing, casting or coating techniques can be used. Subsequently, the ink-filled second dielectric layer is then densified, again in accordance with the teachings of the parent application to form an unfired substrate. The densification, in addition to flattening and compacting the layers, also insures that the vias have flush contact with the circuit and are flush with the top or outer surface of the second dielectric layer. Additionally, a final thick layer 1 to 10 mils of dielectric base may be deposited. Lastly, the substrate is co-fired.

DESCRIPTION OF THE PREFERRED EMBODIMENT(S)

Figure 1:
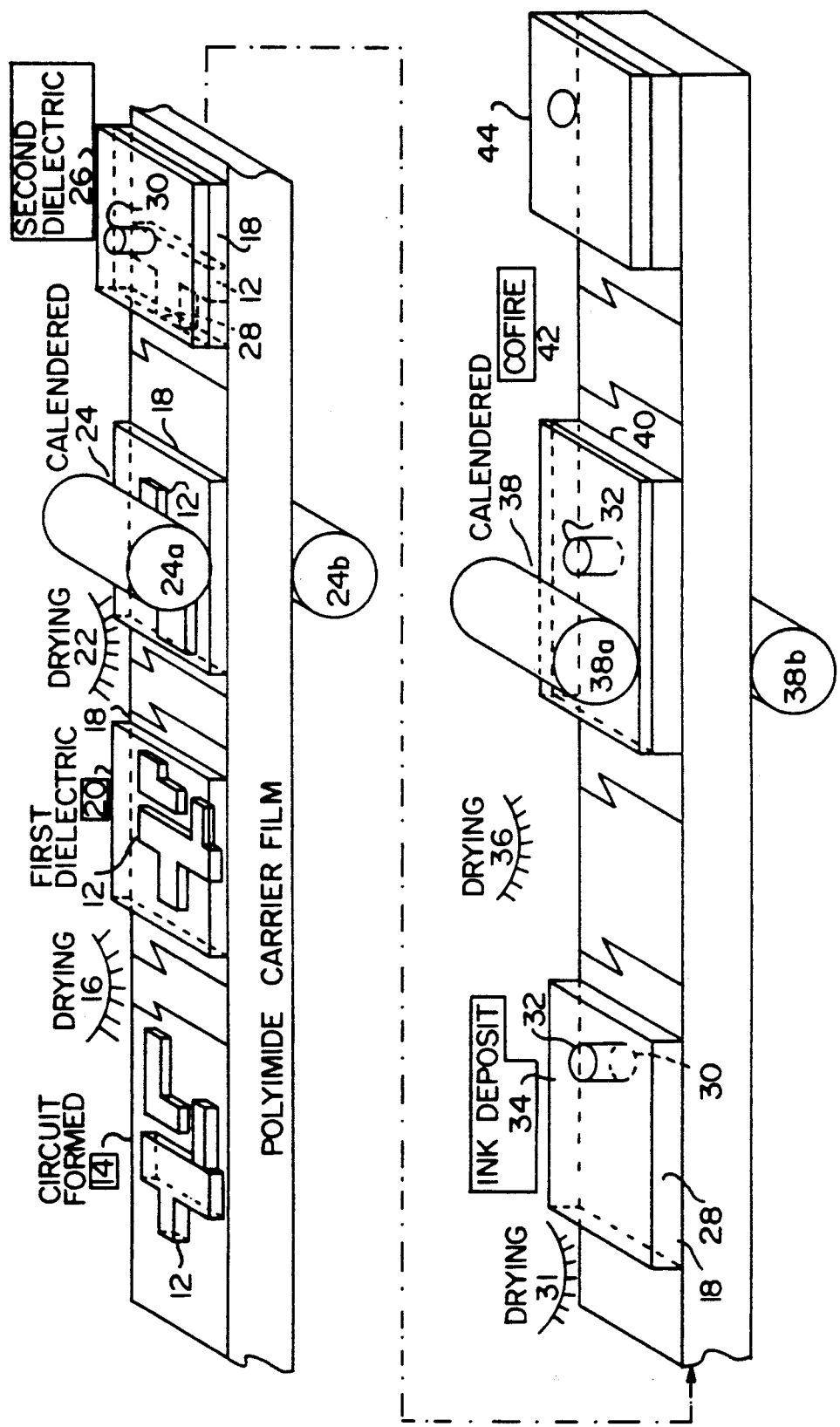
FIG. 1 is a schematic illustration of the steps of a process embodying the invention.
Figure 2:
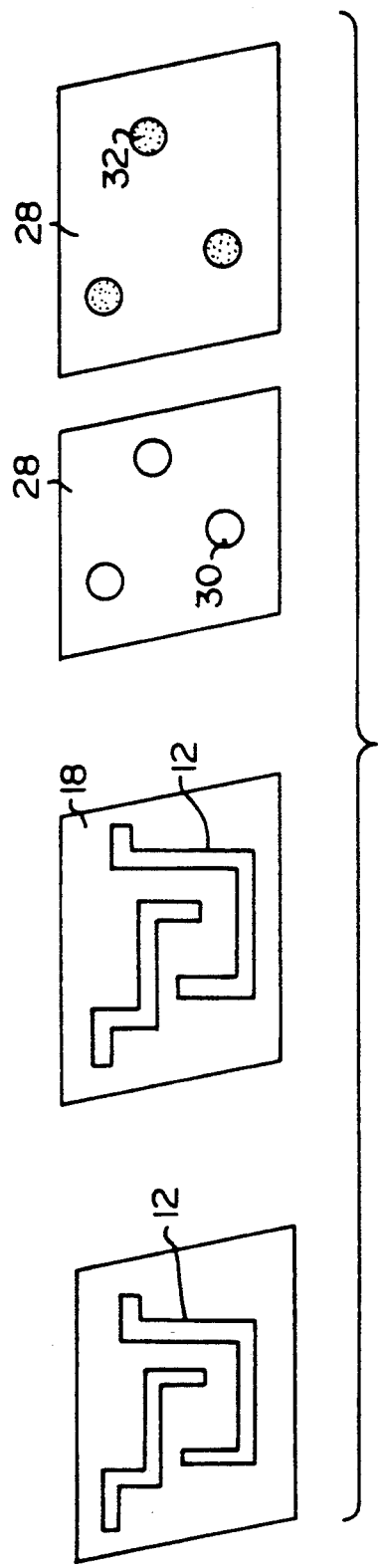
FIG. 2 is a plan view of the substrate formed in accordance with the process of FIG. 1.
Figure 3:
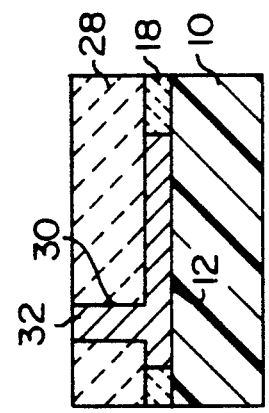
FIG. 3 is a side view of the product.

The invention will be described in reference to the formation of a substrate which can be used as a component in the manufacture of multilayered IC's or multichip modules. Referring to FIG. 1, a support sheet 10, such as a polyimide film of 2 mils thickness, has at 14 a conductive ink printed thereon, such as by a gravure roll, to form a conductive circuit 12. The printed sheet then passes under a dryer 16 at a temperature of between 120° to 220° F. Subsequently, a first dielectric layer 18 is deposited at 20 on the sheet 12, such as by a gravure roll, where the dielectric 18 is coated on the non electrode coated areas of the sheet. The dielectric 18 is then dried at 22 at a temperature of between 120° to 220° F. forming a first circuit surrounded on three sides by a dielectric layer. Subsequently, the first layer is calendered (densified) at 24 by passing through calender rolls 24a and 24b at a nip pressure of 600 psi and room temperature. A variety of calendering temperatures ranging from 0° C. to 200° C. and calendering pressures ranging from 10 psi to 4,000 psi may be used to impart specific enhancements to the resulting first dielectric layer. This step densifies and enhances the uniformity and flatness of the layer. The layer is reduced in thickness approximately 10 to 15%. In this step, the bumps or roughness inherently found in inks and dielectrics are substantially eliminated and the thickness of the layer does not vary more than 5 to 10% from an average thickness resulting again in a superior 'flat' layer. The densified first dielectric layer can be between 50 to 500$\mu$ inches.

At 26 a second dielectric layer 28 is applied, such as by a gravure roll which gravure roll has projections thereon which result in vias 30 being formed in the second dielectric layer 28. The film is then dried by a dryer 31 at a temperature of between 120° to 220° F. At 34 ink 32 is deposited in the vias 30, such as by a gravure roll. The ink-filled second dielectric layer is then dried at 36 at a temperature of between 120° to 220° F. Subsequently, the first and second layers are calendered at 38 by calender rolls 38a and 38b at a nip pressure of 600 psi to form an unfired substrate 40.

This second dielectric layer is reduced in thickness 5 to 25% and can have a thickness ranging between 0.3 to 10 mils. Again, a variety of calendering temperatures ranging from 0° C. to 200° C. and calendering pressures ranging from 10 psi to 4,000 psi may be used to impart specific enhancements to the resulting second dielectric layer. This step densifies and enhances the uniformity and flatness of the layer. In this step, the bumps or roughness inherently found in inks and dielectrics are substantially eliminated and the thickness of the layer does not vary more than 5 to 10% from an average thickness resulting again in a superior 'flat' layer. The densified second dielectric layer can be between 1 to 10 mils.

The substrate 40 is co-fired at 42 in an oven to form the fired substrate 44.

Typically, the foregoing process is carried out using multitrack or in-line series head coaters with multiple drying and calendering stages. These units maintain registration from print to overlay print by use of mechanical, optical or laser alignment devices.

The preferred embodiment has been described with reference to a particular range of processing conditions. Obviously, depending upon the dielectric material used, relative thickness, conductive materials, such as gold, conductive glass, conductive inks, etc., the process conditions will vary. A dielectric such as described in the parent application is suitable for purposes of the preferred embodiment of the invention. Other comparable commercially available dielectrics are also suitable for purposes of the invention as well as various combinations of the conductive materials. A particularly preferred conductive material would be a blend of 85% Ag and 15% palladium.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A method for making a substrate for use in a multilayered integrated circuit or multichip module which comprises:
   coating a conductive material on a surface of a support sheet to form a conductive circuit;
   drying said conductive circuit;
   coating a first dielectric layer on the support surface in the areas where the conductive material is not coated;
   densifying by calendering to form a first densified conductive circuit embedded dielectric layer;
   coating a second dielectric layer over the first densified conductive circuit embedded dielectric layer, said second layer characterized by vias therein which are in communication with at least a portion of the conductive circuit; and
   filling said vias in the second dielectric layer to form electrically conductive vias.

2. The method of claim 1, wherein said support surface is selected from the group consisting of polyester, polyethylene and polyimide film.

3. The method of claim 2, wherein said support surface is approximately 2 mils thick.

4. The method of claim 1, wherein said conductive circuit is a conductive ink, and which comprises: printing said conductive ink on said support surface.

5. The method of claim 4, which comprises:
   printing said conductive ink on said support sheet by screen printing, an ink jet or gravure roll to form a printed sheet.

6. The method of claim 5, which comprises:
   drying said printed sheet at a temperature in the range of 120° to 220° F.

7. The method of claim 1, which comprises:
   coating said dielectric layers by a gravure roll, an ink jet or screen printing.

8. The method of claim 1, which comprises:
   drying said dielectric layers at a temperature in the range of 120° to 220° F.

9. The method of claim 1, wherein the calendaring pressure is in a range of about 10 psi to about 4,000 psi.

10. The method of claim 9, wherein said calendaring pressure is at about 600 psi.

11. The method of claim 1, which comprises:
    calendaring said conductive circuit at a temperature in the range of 0° C. to 200° C.

12. The method of claim 1, wherein the thickness of said first densified conductive circuit is reduced by about 10 to 15% prior to coating said conductive circuit with the second dielectric layer.

13. The method of claim 1, wherein the thickness of said first densified conductive circuit is between 50 to 500$\mu$ inches.

14. The method of claim 1, which comprises:

filling said vias in said second dielectric layer with a conductive ink.

15. The method of claim 1, which comprises:
drying said conductive material at a temperature of between 120° F. to 220° F.

16. The method of claim 1, which includes densifying the second dielectric layer and wherein the thickness of said second dielectric layer after densification is reduced by about 5 to 25%.

17. The method of claim 1, which comprises:
co-firing said substrate to form a fired substrate.

18. The method of claim 1, wherein said vias are circular.

19. The method of claim 18, wherein said vias range in size from about 50 to 1,000μ inches in diameter.

20. The method of claim 19, which comprises:
filling said vias with a conductive material selected from the group consisting of gold, glass, inks and a combination of silver and palladium.

21. The method of claim 20, wherein said combination of silver and palladium is approximately 85% silver and 15% palladium.

* * * * *